United States Patent
Weiss et al.

(10) Patent No.: US 9,449,879 B2
(45) Date of Patent: Sep. 20, 2016

(54) METHOD OF SEVERING A SEMICONDUCTOR DEVICE COMPOSITE

(71) Applicant: OSRAM Opto Semiconductors GmbH, Regensburg (DE)

(72) Inventors: Guido Weiss, Regensburg (DE); Albert Perchtaler, Finning (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/987,910

(22) Filed: Jan. 5, 2016

(65) Prior Publication Data

US 2016/0133520 A1 May 12, 2016

Related U.S. Application Data

(63) Continuation of application No. 14/351,975, filed as application No. PCT/EP2012/069129 on Sep. 27, 2012, now Pat. No. 9,263,334.

(30) Foreign Application Priority Data

Oct. 28, 2011 (DE) .................. 10 2011 054 891

(51) Int. Cl.
*H01L 21/78* (2006.01)
*H01L 21/304* (2006.01)
*B23K 26/38* (2014.01)
*B23K 26/40* (2014.01)
*H01L 21/683* (2006.01)
(Continued)

(52) U.S. Cl.
CPC .............. *H01L 21/78* (2013.01); *B23K 26/38* (2013.01); *B23K 26/40* (2013.01); *H01L 21/3043* (2013.01); *H01L 21/6835* (2013.01); *B23K 26/364* (2015.10); *B23K 2203/172* (2015.10); *B23K 2203/50* (2015.10); *H01L 33/0095* (2013.01); *H01L 33/382* (2013.01); *H01L 2221/68327* (2013.01)

(58) Field of Classification Search
CPC .......................... H01L 21/58; H01L 21/782
See application file for complete search history.

(56) References Cited

U.S. PATENT DOCUMENTS

2001/0035401 A1  11/2001  Manor
2005/0045090 A1  3/2005  Ikegami et al.
(Continued)

FOREIGN PATENT DOCUMENTS

CN          1484328 A       3/2004
DE        602 05 360 T2      6/2006
(Continued)

OTHER PUBLICATIONS

English translation of an Official Action dated Dec. 22, 2014 of corresponding Chinese Application No. 201280053116.0.

*Primary Examiner* — Cheung Lee
(74) *Attorney, Agent, or Firm* — DLA Piper LLP (US)

(57) ABSTRACT

A method of severing a semiconductor device composite includes a carrier having a main surface and a semiconductor layer sequence arranged on the main surface including forming a separating trench in the semiconductor device composite by a first laser cut such that the separating trench only partially severs the semiconductor device composite in a vertical direction running perpendicular to the main surface, and severing the semiconductor device composite completely along the separating trench with a severing cut with a laser.

15 Claims, 3 Drawing Sheets

(51) Int. Cl.
  *H01L 33/00* (2010.01)
  *H01L 33/38* (2010.01)

(56) References Cited

U.S. PATENT DOCUMENTS

| | | |
|---|---|---|
| 2005/0236378 A1 | 10/2005 | Boyle et al. |
| 2006/0169680 A1 | 8/2006 | Park |
| 2009/0065800 A1 | 3/2009 | Wirth et al. |
| 2009/0191693 A1 | 7/2009 | Iizuka |
| 2010/0120228 A1 | 5/2010 | Saito et al. |
| 2010/0290498 A1 | 11/2010 | Hata et al. |
| 2011/0210357 A1 | 9/2011 | Kaiser et al. |
| 2011/0240616 A1 | 10/2011 | Osako et al. |
| 2013/0146910 A1 | 6/2013 | Maute et al. |
| 2015/0236070 A1 | 8/2015 | Moosburger et al. |

FOREIGN PATENT DOCUMENTS

| | | |
|---|---|---|
| DE | 10 2008 050 538 A1 | 2/2010 |
| DE | 10 2009 006 177 A1 | 6/2010 |
| DE | 10 2010 009 717 A1 | 9/2011 |
| EP | 1 376 687 A2 | 1/2004 |
| KR | 2002-0067831 A | 8/2002 |
| WO | 03/002289 A1 | 1/2003 |

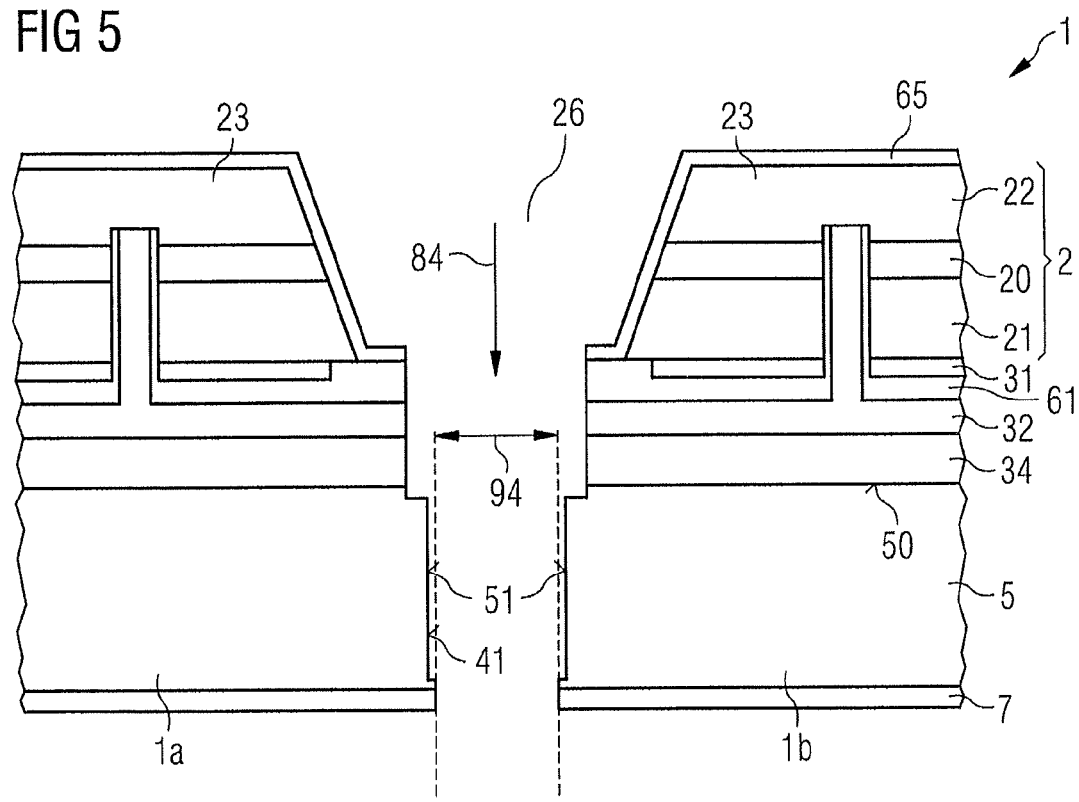

METHOD OF SEVERING A SEMICONDUCTOR DEVICE COMPOSITE

TECHNICAL FIELD

This disclosure relates to a method of severing a semiconductor device composite.

BACKGROUND

A laser separation process can be used for the singulation of semiconductor chips from a semiconductor wafer or wafer composite. It has been shown that waste formed during the process can cover the separated surfaces. This material can have the result that, upon soldering the semiconductor chip, soldering material spreads over the separated surface and causes damage to the semiconductor chip.

There is thus a need to provide a simple and reliable method of severing a semiconductor device composite in which the singulated semiconductor chips can reliably be soldered.

SUMMARY

We provide a method of severing a semiconductor device composite which includes a carrier having a main surface and a semiconductor layer sequence arranged on the main surface including forming a separating trench in the semiconductor device composite by a first laser cut such that the separating trench only partially severs the semiconductor device composite in a vertical direction running perpendicular to the main surface, and severing the semiconductor device composite complete along the separating trench with a severing cut with a laser.

We also provide a method of severing a semiconductor device composite which includes a carrier having a main surface and a semiconductor layer sequence arranged on the main surface, wherein the carrier includes a semiconductor material or a ceramics material, a metal layer is arranged on a side of the carrier remote from the semiconductor layer sequence, the semiconductor layer sequence is fixed to the carrier by a bonding layer, a separating trench is formed in the semiconductor device composite by a first laser cut, the separating trench only partially severing the semiconductor device composite in a vertical direction running perpendicular to the main surface, the semiconductor device composite is severed completely along the separating trench with a severing cut with a laser, and a second laser cut is made along the separating trench between the first laser cut and the severing cut, the second laser cut only removing material of the carrier.

We further provide a method of severing a semiconductor device composite including a carrier having a main surface and a semiconductor layer sequence arranged on the main surface, wherein the carrier comprises a semiconductor material or a ceramics material; a metal layer is arranged on a side of the carrier remote from the semiconductor layer sequence; the semiconductor layer sequence is fixed to the carrier by a bonding layer; a separating trench is formed in the semiconductor device composite by a first laser cut such that the separating trench only partially severs the semiconductor device composite in a vertical direction running perpendicular to the main surface; the semiconductor device composite is severed completely along the separating trench with a severing cut with a laser; and a second laser cut is made along the separating trench between the first laser cut and the severing cut, the second laser cut only removing material of the carrier.

BRIEF DESCRIPTION OF THE DRAWINGS

FIGS. 1 to 5 show an example of a method of severing a semiconductor device composite with reference to intermediate steps each shown schematically in a side view.

DETAILED DESCRIPTION

Figure 1:
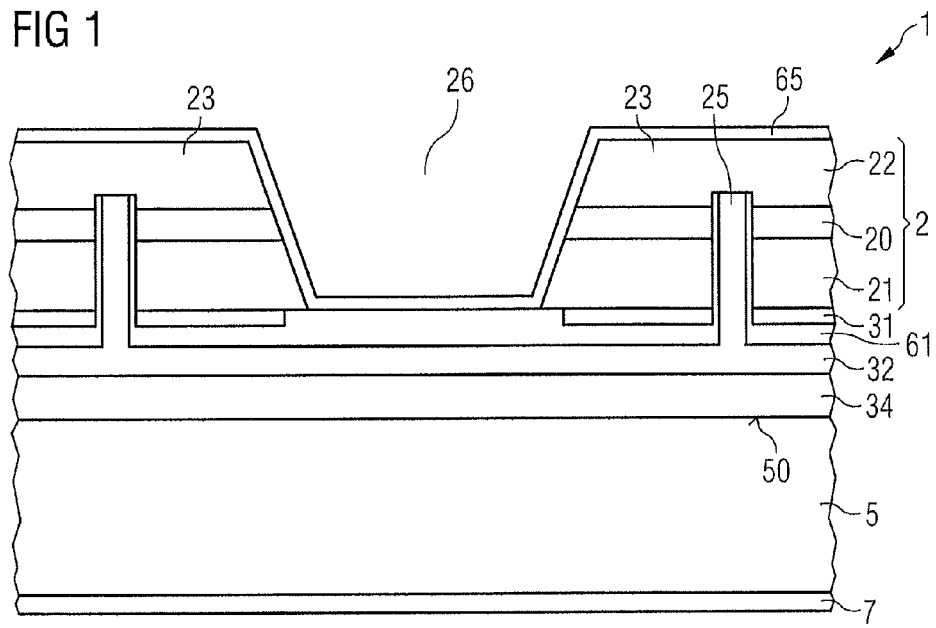

In our method of severing a semiconductor device composite which comprises a carrier having a main surface and a semiconductor layer sequence arranged on the main surface, a separating trench may be formed in the semiconductor device composite by a first laser cut. The separating trench only partially severs the semiconductor device composite in a vertical direction running perpendicular to the main surface. The semiconductor device composite is severed completely along the separating trench with a severing cut by a laser.

Singulation of the semiconductor device composite into individual semiconductor chips is accordingly carried out by at least two laser cuts which, when the semiconductor device composite is seen from above, run in the same lateral direction. The higher the number of laser cuts for singulation, the smaller the volume of waste formed during the individual laser cuts.

In this context, the term "waste" generally denotes the material that forms during a laser cut. This material comprises in particular molten material or material of the layer to be separated that has otherwise been removed.

Irradiation of the semiconductor device composite with laser radiation is preferably carried out from the side of the semiconductor layer sequence remote from the carrier. Adjustment of the cut direction relative to a structuring of the semiconductor layer sequence is thus simplified.

Preferably, the semiconductor device composite has a metal layer arranged on a side of the carrier remote from the semiconductor layer sequence. In the singulated semiconductor chip, the metal layer is preferably provided for mounting and/or electrical connection to a terminal carrier, for example, a housing or a printed circuit board. The metal layer can in particular cover the carrier completely on the side remote from the semiconductor layer sequence. The metal layer can be in single-layer or multi-layer form.

Preferably, a bottom surface of the separating trench is arranged in the vertical direction between the metal layer and the main surface prior to the severing cut. In other words, the metal layer is treated only with the final laser cut, that is to say the severing cut.

The metal layer preferably has a thickness substantially smaller than the thickness of the carrier. The carrier is preferably at least 5 times as thick as the metal layer, particularly preferably at least 20 times as thick. The thinner the metal layer relative to the thickness of the carrier, the smaller the risk that the severing cut will result in a large area of the side surfaces of the separating trench being covered with metal material of the metal layer, in particular in the vertical direction as far as the main surface. Upon mounting the singulated semiconductor chips, the risk of creeping of a bonding agent, for example, of a solder over the side surfaces of the carriers of the singulated semiconductor chips is thus eliminated or at least largely reduced in a simple and reliable manner.

Preferably, the semiconductor layer sequence is fixed to the carrier by a bonding layer. In other words, the semiconductor layer sequence may be bonded to the carrier by a material-based bond. The bonding layer can be in the form of, for example, a solder layer or an adhesive layer, in particular an electrically conductive adhesive layer. The carrier is thus different from a growth substrate for the semiconductor layer sequence, which is preferably deposited epitaxially, and stabilizes the semiconductor layer sequence mechanically.

Preferably, the first laser cut severs the bonding layer completely.

The first laser cut can in particular reach into the carrier. The first laser cut accordingly severs at least all the layers arranged between the semiconductor layer sequence and the carrier.

However, the method can also be used for a semiconductor device composite in which the carrier forms the growth substrate for the semiconductor layer sequence. In that case there is no bonding layer between the semiconductor layer sequence and the carrier.

Preferably, a second laser cut, which only partially severs the carrier, is made along the separating trench between the first laser cut and the severing cut. Preferably, the second laser cut only removes material of the carrier, that is to say it does not remove in particular material of the bonding layer or material of the metal layer.

The waste formed in the second laser cut accordingly comprises substantially the material of the carrier.

There is suitable for the carrier in particular a semiconductor material, for example, germanium, silicon or gallium arsenide. The semiconductor material can be doped to increase the electrical conductivity. Alternatively or in addition, the carrier can comprise a ceramics material, for example, aluminum nitride or boron nitride, or can consist of such a material.

The waste formed in the second laser cut accordingly comprises substantially a material that is electrically insulating or at least has only poor electrical conductivity as compared to a metal. The side surfaces of the separating trench, which in the singulated semiconductor chips in each case constitute the side surfaces delimiting the carrier of the semiconductor chip in the lateral direction, are accordingly covered at least in places with a layer that is electrically insulating or at least has low electrical conductivity as compared with a metal layer.

Preferably, a third laser cut which only partially severs the carrier, is made along the separating trench between the second laser cut and the severing cut. The third laser cut is accordingly likewise made wholly within the carrier material. The third laser cut is provided in particular to minimize the thickness of the semiconductor device composite that is to be severed with the severing cut. The smaller that thickness, the smaller the volume of the waste, in particular waste comprising metal of the metal layer, that is spread over the side surfaces of the separating trench in the severing step.

Preferably, the semiconductor layer sequence is structured into device regions prior to the first laser cut. Between the adjacent devices there is preferably formed a gap which completely severs the semiconductor layer sequence of the device regions.

The separating trenches preferably run between adjacent device regions, in particular in the region of the gaps. Accordingly, the first laser cut preferably does not sever the material of the semiconductor layer sequence but severs substantially only the material arranged between the semiconductor layer sequence and the carrier and material of the carrier.

Further preferably, the semiconductor layer sequence is deposited epitaxially on a growth substrate and the growth substrate is removed. Also preferably, the device regions are formed after the growth substrate has been removed. In that case, the semiconductor layer sequence is preferably fixed to the carrier by the bonding layer before structuring into device regions is carried out. Alternatively, however, the device regions can also be formed before the semiconductor layer sequence is fixed to the carrier.

We discovered that the described multistage severing by a plurality of laser cuts may avoid the side surfaces of the singulated semiconductor chips from being covered with waste to such an extent that, upon mounting of the semiconductor chips, a fixing material, for example, a solder, is able to creep over the side surface of the carrier as far as the semiconductor layer sequence. Such creeping can be prevented or at least reduced sufficiently even in the case of a comparatively small carrier thickness. The thickness of the carrier can accordingly be reduced.

The carrier preferably has a thickness of at most 200 µm, particularly preferably of at most 150 µm. The overall height of the semiconductor chip can thus be reduced without substantially increasing the risk of mounting-related failure of the semiconductor chip.

Further features and expediencies will become apparent from the following description of an example in conjunction with the figures.

In the figures, identical, similar or identically acting elements are provided with the same reference numerals. The figures and the relative sizes of the elements shown in the figures should not be regarded as being to scale. Instead, individual elements may be shown exaggeratedly large for the purpose of clarity and/or better understanding.

FIGS. 1 to 5 each show schematically a side view of a section of a semiconductor device composite 1. The method is described by way of example with reference to a semiconductor device composite from which optoelectronic semiconductor chips, in particular luminescent diode chips, are produced upon singulation.

The semiconductor device composite 1 comprises a carrier 5 having a main surface 50. A semiconductor layer sequence 2 is arranged on the main surface. The semiconductor layer sequence has an active region 20 that generates radiation and is arranged between a first semiconductor layer 21 and a second semiconductor layer 22. The first semiconductor layer 21 is arranged between the active region 20 and the carrier 5. The semiconductor layer sequence, in particular the active region, is preferably based on a III-V compound semiconductor material, for example, a nitride, phosphide or arsenide compound semiconductor material.

The semiconductor layer sequence 2 is divided into device regions 23, each provided for a semiconductor chip. A gap 26 is formed between adjacent device regions. The gap severs the semiconductor layer sequence preferably completely in the vertical direction, that is to say perpendicular to a main extension plane of the semiconductor layers of the semiconductor layer sequence. The gaps 26 can be formed before or after the semiconductor layer sequence is arranged on the carrier 5.

The semiconductor layer sequence 2 has a plurality of recesses 25 extending from the carrier 5 through the first semiconductor layer 21 and the active region 20 into the second semiconductor layer. The first semiconductor layer 21 connects electrically conductively to a first terminal layer 31. The second semiconductor layer 22 connects electrically conductively in the region of the recesses 25 to a second terminal layer 32. The first terminal layer 31 and the second terminal layer 32 each run in places between the carrier 5 and the semiconductor layer sequence 2. To avoid an electrical short circuit, an insulating layer 61 is formed between the second terminal layer 32 and the first terminal layer 31 as well as between the second terminal layer and the first semiconductor layer 21 in the region of the recesses 25.

A passivation layer 65 is formed on a side of the semiconductor layer sequence 2 remote from the carrier 5, which passivation layer 65 also covers the side surfaces of the semiconductor layer sequence in the region of the gap 26.

The semiconductor layer sequence 2 is fixed to the carrier 5 by a bonding layer 34, for example, an electrically conductive adhesive layer or a solder layer. The carrier 5 is accordingly different from a growth substrate for the semiconductor layer sequence 2. The growth substrate is removed after epitaxial deposition of the semiconductor layer sequence and is therefore not shown in FIG. 1. Formation of the gaps 26 to form the individual device regions 23 of the semiconductor layer sequence is preferably carried out after the growth substrate has been removed.

A metal layer 7 is formed on the side of the carrier 5 remote from the semiconductor body 2. The metal layer covers the carrier completely. In the singulated semiconductor chips, the metal layer is provided in particular to fix the semiconductor chips on the metal layer side to a terminal carrier, for example, a housing or a printed circuit board by a fixing layer, for example, a solder, and contacting them electrically conductively therewith.

Figure 2:
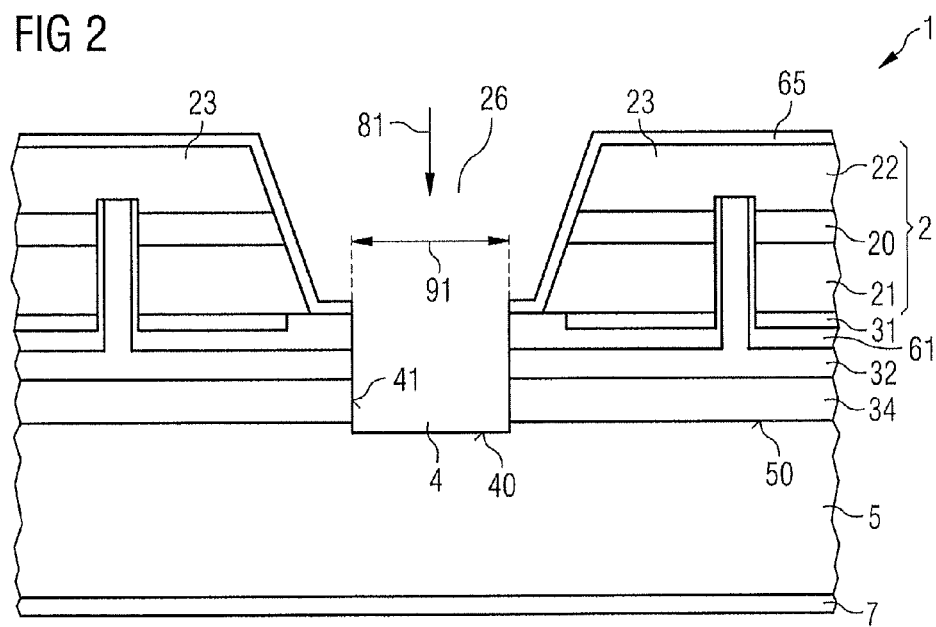

To sever the semiconductor device composite 1, a separating trench 4 is formed, as shown in FIG. 2, by a first laser cut. The separating trench runs in the lateral direction along the gap 26. The first laser cut accordingly does not sever the semiconductor layers of the semiconductor layer sequence 2. Irradiation by the laser radiation during the first laser cut is illustrated by an arrow 81. A cut width 91 of the first laser cut is also shown schematically. Irradiation is carried out from a side of the semiconductor layer sequence 2 remote from the carrier 5, in the direction towards the carrier. Orientation of the cut direction along the gap 26 is thus facilitated.

In the example shown, the first laser cut is made such that the laser cut extends into the carrier 5. All the layers between the semiconductor layer sequence 2 and the carrier 5, in particular the bonding layer 34, are accordingly severed by the first laser cut. Furthermore, the first terminal layer 31 and the second terminal layer 32 are also severed. A bottom surface 40 of the separating trench 4 accordingly runs between the main surface 50 and the metal layer 7. The first laser cut is preferably so executed that it extends only slightly into the carrier 5, for example, by 20 µm or less, preferably by 10 µm or less.

Figure 3:
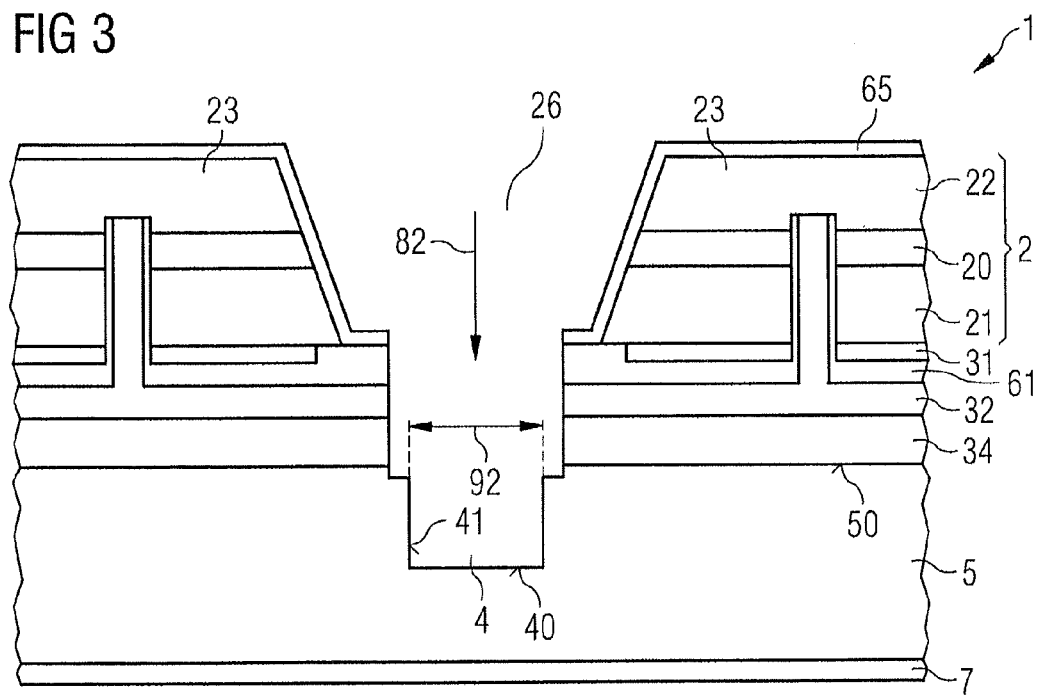

In FIG. 3, execution of a second laser cut is shown schematically, irradiation of the laser again being illustrated by an arrow 82. A cut width 92 of the second laser cut is preferably smaller than the cut width of the first laser cut. As a result, substantially only material of the carrier 5 is removed in the second laser cut. The waste that forms upon removal accordingly comprises substantially the carrier material 5 so that the side surfaces 41 of the separating trench 4 are substantially covered with the carrier material. Waste formed in the second laser cut accordingly comprises only a very small residual amount of metallic material of the layers arranged between the carrier 5 and the semiconductor layer sequence 2, in particular of the bonding layer 34

In this example, the second laser cut is made such that the carrier 5 is severed only partially, that is to say not completely.

Figure 4:
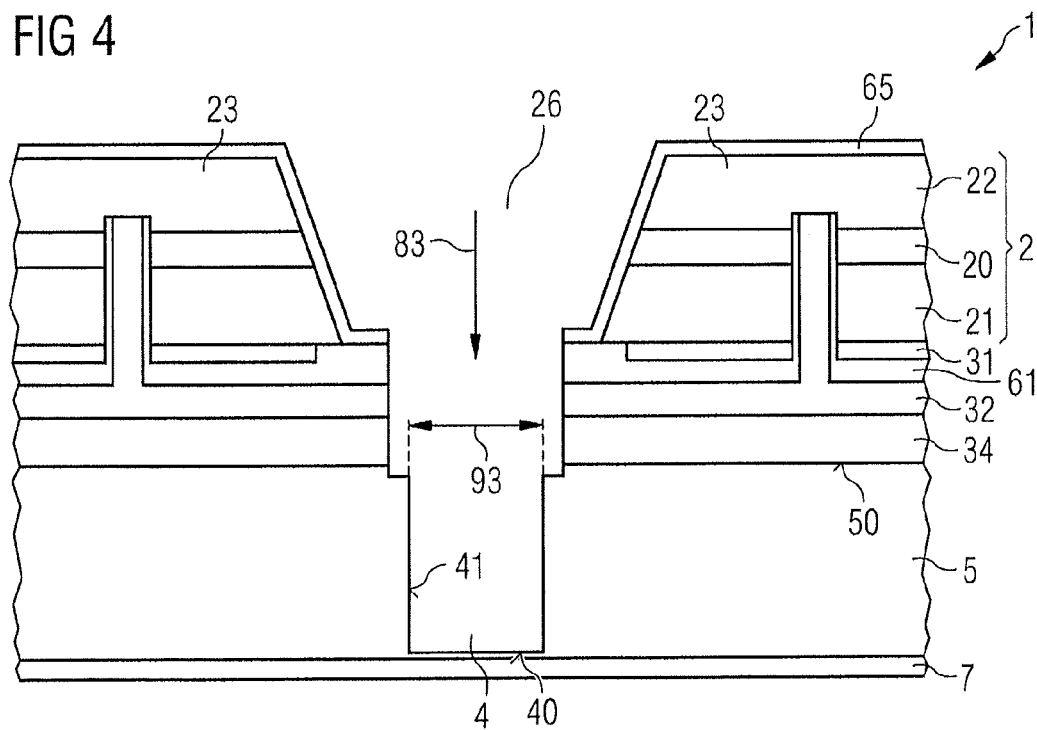

In FIG. 4, a third laser cut is shown schematically, an arrow 83 showing the laser radiation. A cut width 93 of the third laser cut can correspond to the cut width of the second laser cut or can be smaller than the cut width of the second laser cut. The third laser cut is preferably made such that the carrier 5 is again not severed completely. Waste formed during the third laser cut is accordingly free of material of the metal layer 7.

In a subsequent severing step, the semiconductor device composite 1 is severed completely as is shown in FIG. 5 so that semiconductor chips 1a, 1b that are mechanically separate from one another are formed.

An arrow 84 illustrates irradiation of the laser during the severing cut. A cut width 94 of the severing cut is preferably smaller than the cut widths of the preceding laser cuts. The laser cut preceding the severing cut, that is to say the third laser cut in the example shown, is preferably carried out such that the bottom surface 40 of the separating trench 4 is at only a comparatively small distance from the metal layer. The distance is preferably at most 20 µm, particularly preferably at most 10 µm. The smaller the distance from the metal layer, the smaller the volume of the waste formed in the severing cut, for an equal severing length. The risk that the waste comprising material of the metal layer 7 will cover a large area of the side surface 51 of the carrier 5, in particular in the vertical direction as far as the main surface 50, can accordingly be minimized.

The carrier 5 is preferably substantially thicker than the metal layer 7, preferably at least 5 times as thick, particularly preferably at least 20 times as thick. The risk of a covering of waste extending along the side surface 51 as far as the main surface 50 can accordingly largely be avoided.

The metal layer 7 preferably has a thickness of 0.5 µm to 10 µm, preferably 1 µm to 5 µm. The metal layer can cover the carrier 5 completely on the side remote from the semiconductor layer sequence. Structuring of the metal layer before the severing cut is accordingly not necessary.

Creeping of the fixing agent over the side surface of the carrier 5 can thus be avoided even for comparatively thin carriers. The thickness of the carrier 5 is preferably at most 200 µm, particularly preferably at most 150 µm. The height of the singulated semiconductor chips 1a, 1b can accordingly be reduced.

The step-like form of the side surfaces 41, which is the result of the different cut widths of the laser cuts, is exaggerated in the figures. The side surfaces of the singulated semiconductor chips can in fact be substantially flat.

In a departure from the described example, a number of laser cuts other than four, for example, two, three, five or six laser cuts, may be expedient. Preferably at least one laser cut removes only material of the carrier 5.

The described method is suitable generally for singulation of semiconductor device composites into semiconductor chips. In particular, the semiconductor chips can also be in such a form that the second semiconductor layer 22 is electrically contactable from the side of the semiconductor layer sequence remote from the carrier 5. In that case, the recesses 25 and the second terminal layer arranged between the semiconductor layer sequence 2 and the carrier 5 are not required. Furthermore, in a departure from the described example, the semiconductor device composite can also have a semiconductor layer sequence 2 in which the carrier 5 constitutes the growth layer. In that case, a bonding layer 34 is accordingly not arranged between the semiconductor layer sequence 2 and the carrier 5.

Furthermore, the method can be used largely independently of the arrangement of the external contacts of the semiconductor chip. For example, a contact can be arranged on the side of the carrier remote from the semiconductor layer sequence and a contact can be arranged on the side of the carrier facing the semiconductor layer sequence. However, it is also possible for two or more contacts to be arranged on the side remote from the semiconductor layer sequence or on the side facing the semiconductor layer sequence.

The method can, of course, also be used for other optoelectronic semiconductor devices, in particular semiconductor chips, for example, radiation receivers or semiconductor lasers or also for electronic semiconductor chips.

The method is suitable in particular for singulation of semiconductor device composites in which at least one metal layer is arranged on at least one main surface, in particular on two opposing main surfaces of the carrier 5 and is to be severed upon singulation.

Our methods are not limited as a result of the description given with reference to the examples. Instead, this disclosure encompasses any novel feature and any combination of features, including in particular any combination of features in the appended claims, even if that feature or combination is not itself explicitly indicated in the claims or examples.

The invention claimed is:

1. A method of severing a semiconductor device composite comprising a carrier having a main surface and a semiconductor layer sequence arranged on the main surface, wherein the carrier comprises a semiconductor material or a ceramics material;

a metal layer is arranged on a side of the carrier remote from the semiconductor layer sequence;

the semiconductor layer sequence is fixed to the carrier by a bonding layer;

a separating trench is formed in the semiconductor device composite by a first laser cut such that the separating trench only partially severs the semiconductor device composite in a vertical direction running perpendicular to the main surface;

the semiconductor device composite is severed completely along the separating trench with a severing cut with a laser;

a second laser cut is made along the separating trench between the first laser cut and the severing cut, the second laser cut only removing material of the carrier; and side faces of the separating trench are covered with waste formed in the second laser cut.

2. The method according to claim 1, wherein the metal layer completely covers the carrier.

3. The method according to claim 2, wherein the metal layer is only treated with the severing cut.

4. The method according to claim 1, wherein a bottom surface of the separating trench is arranged in the vertical direction between the metal layer and the main surface prior to the severing cut.

5. The method according to claim 1, wherein the first laser cut completely severs the bonding layer.

6. The method according to claim 1, wherein the first laser cut reaches into the carrier.

7. The method according to claim 1, wherein a third laser cut, which only partially severs the carrier, is made along the separating trench between the second laser cut and the severing cut.

8. The method according to claim 1, wherein the semiconductor layer sequence is structured into device regions prior to the first laser cut.

9. The method according to claim 8, wherein the separating trench runs between adjacent device regions.

10. The method according to claim 8, wherein the semiconductor layer sequence is epitaxially deposited on a growth substrate, the growth substrate is removed, and the device regions are formed after the growth substrate has been removed.

11. The method according to claim 1, wherein the semiconductor layer sequence is epitaxially deposited on a growth substrate and the growth substrate is removed.

12. The method according to claim 1, wherein the carrier is based on a semiconductor material.

13. The method according to claim 1, wherein the carrier has a thickness of at most 200 µm.

14. The method according to claim 1, wherein a cut width of the second layer cut is smaller than a cut width of the first laser cut.

15. The method according to claim 1, wherein the waste consists essentially of material of the carrier.

* * * * *